(12) United States Patent  
Liaw

(10) Patent No.: US 7,486,541 B2
(45) Date of Patent: Feb. 3, 2009

(54) RESISTIVE CELL STRUCTURE FOR REDUCING SOFT ERROR RATE

(75) Inventor: Jhon Jhy Liaw, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 230 days.

(21) Appl. No.: 11/699,189

(22) Filed: Jan. 29, 2007

(65) Prior Publication Data

US 2007/0127287 A1    Jun. 7, 2007

Related U.S. Application Data

(60) Continuation-in-part of application No. 10/842,379, filed on May 10, 2004, now abandoned, and a continuation-in-part of application No. 11/287,449, filed on Nov. 22, 2005, now Pat. No. 7,307,871, which is a division of application No. 10/460,983, filed on Jun. 13, 2003, now Pat. No. 6,992,916.

(51) Int. Cl.
*G11C 11/00* (2006.01)
*G11C 5/06* (2006.01)
*H01L 27/11* (2006.01)

(52) U.S. Cl. ............... 365/154; 365/63; 365/148; 365/156; 257/368; 257/369

(58) Field of Classification Search .............. 365/154, 365/155, 156, 63; 257/368
See application file for complete search history.

(56) References Cited

U.S. PATENT DOCUMENTS

| | | | |
|---|---|---|---|
| 4,805,147 A | 2/1989 | Yamanaka et al. | |
| 4,805,148 A | 2/1989 | Diehl-Nagle et al. | |
| 4,905,078 A | 2/1990 | Sagara et al. | |
| 4,956,815 A | 9/1990 | Houston | |
| 5,126,279 A | 6/1992 | Roberts | |
| 5,135,882 A | 8/1992 | Karniewicz | |
| 5,172,211 A | 12/1992 | Godinho et al. | |
| 5,179,434 A | 1/1993 | Hiruta | |
| 5,204,990 A | 4/1993 | Blake et al. | |
| 5,504,703 A | 4/1996 | Bansal | |
| 5,585,302 A * | 12/1996 | Li | ............... 438/384 |

(Continued)

FOREIGN PATENT DOCUMENTS

JP        60083366        5/1985

(Continued)

*Primary Examiner*—Ly D Pham
(74) *Attorney, Agent, or Firm*—Duane Morris LLP

(57) ABSTRACT

A memory cell for reducing soft error rate and the method for forming same are disclosed. The memory cell comprises a first bit line signal (BL), a second bit line signal complementary to the first bit line signal (BLB), a first pass gate coupled to the BL, a second pass gate coupled to the BLB, a first inverter whose output node receives the BL through the first pass gate, a second inverter whose output node receives the BLB through the second pass gate, a first instrument coupled between the output node of the first inverter and an input node of the second inverter, and a second instrument coupled between the output node of the second inverter and an input node of the first inverter, wherein the first and second instruments increase voltage discharge time of the memory cell when voltages at the output nodes of the inverters accidentally discharge.

20 Claims, 10 Drawing Sheets

U.S. PATENT DOCUMENTS

| | | | |
|---|---|---|---|
| 5,612,245 A * | 3/1997 | Saito | 438/217 |
| 5,627,395 A | 5/1997 | Witek et al. | |
| 5,631,863 A | 5/1997 | Fechner et al. | |
| 5,726,474 A | 3/1998 | Miller et al. | |
| 5,754,467 A | 5/1998 | Ikeda et al. | |
| 5,780,909 A * | 7/1998 | Hayashi | 257/393 |
| 5,905,290 A | 5/1999 | Houston | |
| 5,917,212 A | 6/1999 | Blake et al. | |
| 6,111,780 A * | 8/2000 | Bertin | 365/154 |
| 6,180,984 B1 | 1/2001 | Golke et al. | |
| 6,225,230 B1 | 5/2001 | Nitta et al. | |
| 6,271,568 B1 | 8/2001 | Woodruff et al. | |
| 6,369,630 B1 * | 4/2002 | Rockett | 327/210 |
| 6,717,233 B1 | 4/2004 | Haddad et al. | |
| 6,756,692 B2 | 6/2004 | Hirano et al. | |
| 6,787,846 B2 | 9/2004 | Honda | |
| 6,992,916 B2 | 1/2006 | Liaw | |
| 2001/0030372 A1 * | 10/2001 | Mori et al. | 257/903 |
| 2002/0014668 A1 * | 2/2002 | Susami | 257/369 |
| 2002/0130426 A1 * | 9/2002 | Karasawa et al. | 257/903 |
| 2002/0177260 A1 * | 11/2002 | Matsumoto | 438/154 |
| 2003/0006433 A1 | 1/2003 | Funayama et al. | |
| 2004/0136128 A1 | 7/2004 | Kato | |
| 2005/0248977 A1 | 11/2005 | Liaw | |

FOREIGN PATENT DOCUMENTS

| | | |
|---|---|---|
| JP | 2000149764 | 5/2000 |

* cited by examiner

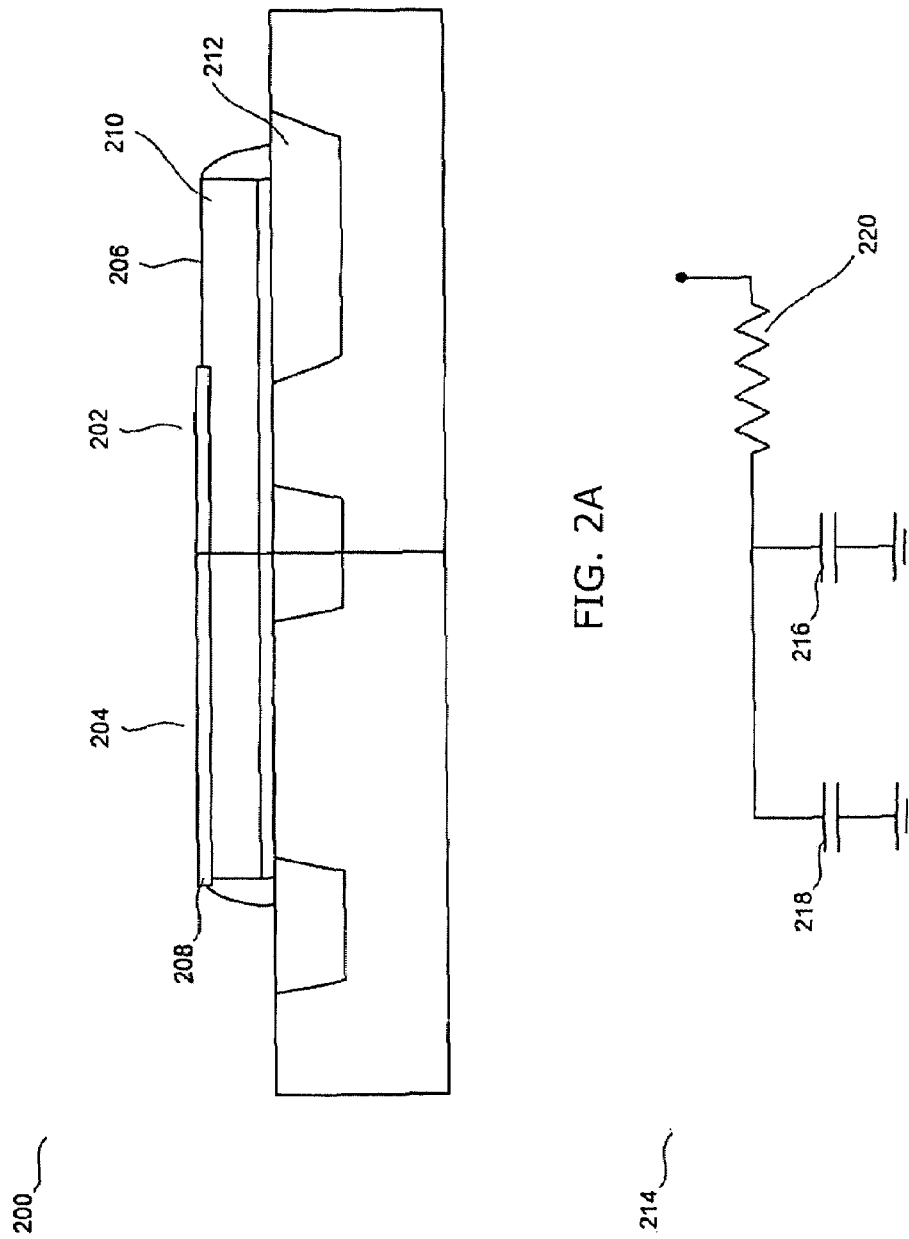

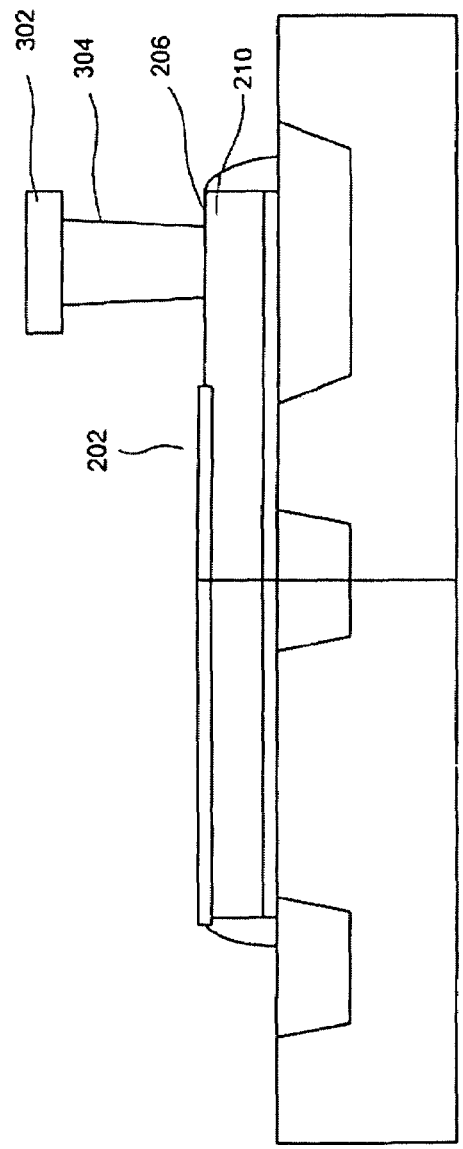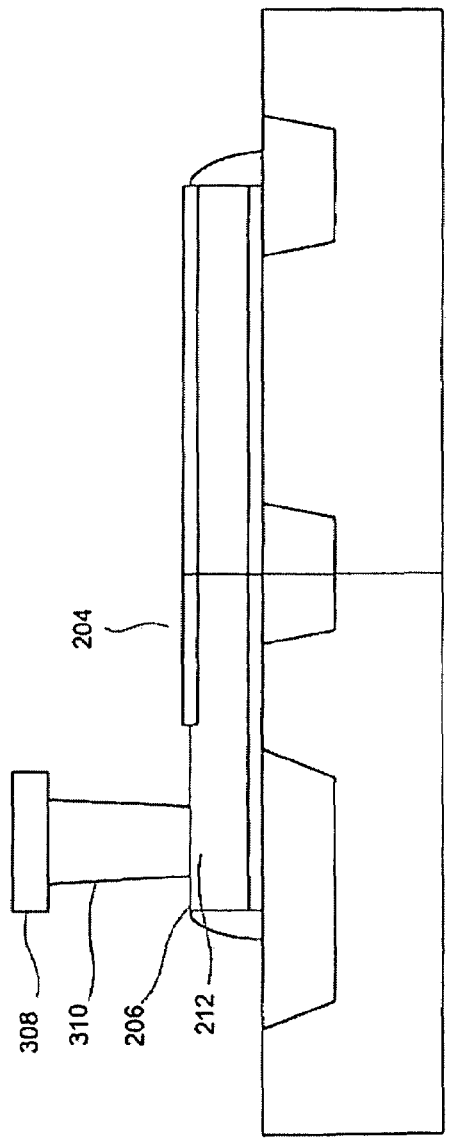

US 7,486,541 B2

RESISTIVE CELL STRUCTURE FOR REDUCING SOFT ERROR RATE

CROSS-REFERENCE TO RELATED APPLICATION

This is a continuation-in-part of U.S. patent application Ser. No. 10/842,379 to Jhon Jhy Liaw, filed May 10, 2004, now abandoned titled "Resistive Cell Structure for Reducing Soft Error Rate," and is a continuation-in-part of U.S. patent application Ser. No. 11/287,449 to Jhon Jhy Liaw, filed Nov. 22, 2005, now U.S. Pat. No. 7,307,871 titled "SRAM Cell Design with High Resistor CMOS Gate Structure for Soft Error Rate Improvement," which is a divisional of U.S. patent application Ser. No. 10/460,983 to Jhon Jhy Liaw, filed Jun. 13, 2003, now U.S. Pat. No. 6,992,916, titled "SRAM Cell Design with High Resistor CMOS Gate Structure for Soft Error Rate Improvement" the contents of which are expressly incorporated by reference herein in their entirety.

BACKGROUND

This invention relates generally to semiconductor memories, and more particularly, to the improvement of soft error rate through the addition of high resistor cell structures.

Semiconductor memories are composed of large arrays of individual cells. Each cell stores a 1 or 0 bit of data as an electrical high or low voltage state. At least 8 bits may compose a byte of data. At least 16 bits may compose a word. In each memory operation cycle, at least one byte is typically written into or read from the array. Cells are arranged at the crossings of vertical data, or bit lines, and horizontal word lines, which enable reading or writing. A read or write cycle occurs when a word line, as well as a pair of bit lines, are activated. The cell accessed at the intersection of the word lines and the bit lines will either receive written data from the bit lines, or will deliver written data to the bit lines. Cells can typically be accessed in random order.

A cell is composed of an electronic circuit, typically involving transistors. A Static Random Access Memory (SRAM) cell is most typically composed of a plurality of metal-oxide-semiconductor field-effect-transistors (MOS-FETs). The most common type of SRAM is composed of six-transistor (6T) cells, each of which includes two P-type MOSFETs (PMOSFETs) and four N-type MOSFETs (NMOSFETs). A cell is arranged with two inverters that are accessed from two complementary bit lines through two access transistors that are controlled by a word line. This structure has low power consumption and good immunity to electronic noise on bit or word lines or to charges introduced by alpha particles.

However, as more technologies that utilize semiconductor memories require a smaller footprint and a higher mobility, space saving in semiconductor memory designs becomes increasingly important. In particular, in order to continually achieve size and performance advantages, cell geometries must continually shrink. However, as cell geometries shrink, one problem arises. Each of the two inverter storage nodes in an SRAM cell is composed of the capacitances of the gates of the two transistors of that inverter. As geometries shrink, the storage capacitances also shrink. The charge, which is stored as data, is now so small that electrical noise on either of the bit lines or the word lines, or charges introduced by the arrival of an alpha particle, can be significant in comparison. The frequency of error caused by this electrical noise, which may be in the form of alpha particles, is known as soft error rate. As soft error rate increases, the risk of losing data integrity increases. Noise immunity, therefore, is an area in semiconductor memory designs that merits increasing concern.

Desirable in the art of semiconductor memory designs are additional designs that increases noise immunity, thereby reducing soft error rate.

SUMMARY

In view of the foregoing, this invention provides a design and method to increase noise immunity, thereby reducing soft error rate.

A memory cell for reducing soft error rate and the method for forming the same are disclosed. The memory cell comprises a first bit line signal (BL), a second bit line signal complementary to the first bit line signal (BLB), a first pass gate coupled to the BL, a second pass gate coupled to the BLB, a first inverter whose output node receives the BL through the first pass gate, a second inverter whose output node receives the BLB through the second pass gate, a first instrument coupled between the output node of the first inverter and an input node of the second inverter, and a second instrument coupled between the output node of the second inverter and an input node of the first inverter, wherein the first and second instruments increase voltage discharge time of the memory cell when voltages at the output nodes of the inverters accidentally discharge.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2A illustrates a cross section of the inverters of the SRAM cell with the additional resistors in accordance with one embodiment of the present invention.

FIG. 2B illustrates a circuit diagram equivalent to the device in FIG. 2A in accordance with one embodiment of the present invention.

FIGS. 3A-3B illustrate cross sections of the inverters of the SRAM cell with the additional resistors and metal-1 connections in accordance with one embodiment of the present invention.

DESCRIPTION

This invention provides a design for reducing soft error rate with the addition of two resistors to a standard SRAM cell, thereby increasing noise immunity and data integrity. In several embodiments shown below, a standard SRAM cell is modified to include resistors, the addition of which introduces a resistor/capacitor (RC) delay time for the change of stored data. Since the two inverters in the standard SRAM cell are cross-coupled, the return influence is also delayed. The delay time may allow the affected inverter to heal itself and retain its original data, thereby reducing the frequency and probability of error due to alpha particle noise. Soft error rate is therefore also reduced, and greater data integrity is assured.

Figure 1:
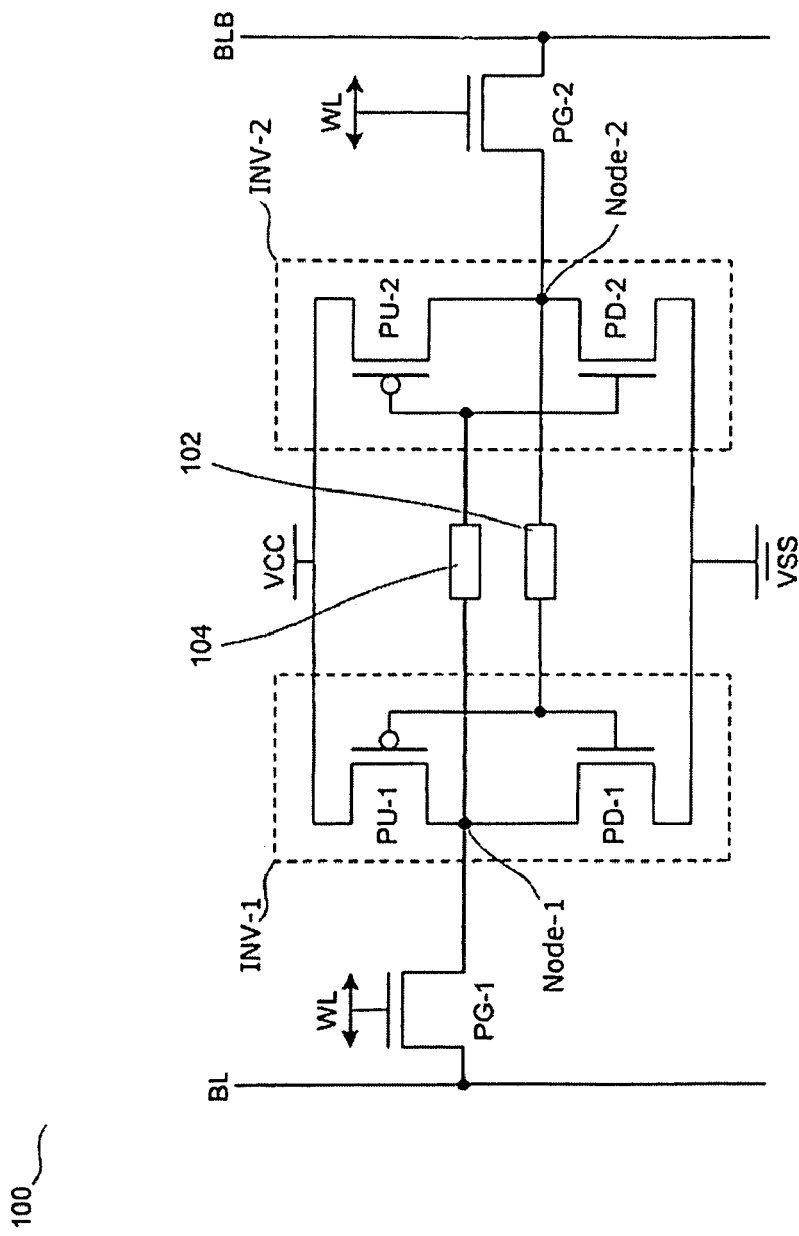
FIG. 1 illustrates a standard six-transistor SRAM cell with two additional resistors in accordance with one embodiment of the present invention.

FIG. 1 illustrates a standard six-transistor static random access memory (SRAM) cell 100 with two additional resistors 102 and 104. Pull-up transistor PU-1 and pull-down transistor PD-1 form inverter INV-1. Similarly, pull-up transistor PU-2 and pull-down transistor PD-2 form inverter INV-2. Each of these resistors is placed between one inverter output node and the gates of the opposite inverter. From Node-2, a resistor 102 is in series with the parallel combination of the gate-to-substrate capacitance of a pull-up transistor PU-1 and of a pull-down transistor PD-1. From Node-1, a resistor 104 is in series with the parallel combination of the gate-to-substrate capacitance of a pull-up transistor PU-2 and of a pull-down transistor PD-2. Node-2 is also connected, through a pass-gate transistor PG-2, to bit line bar BLB. Node-1 is also connected, through a pass-gate transistor PG-1 to bit line BL. Pass-gate transistors PG-1 and PG-2 are switched by the word-line WL.

FIG. 2A presents a cross section 200 of the inverters of the SRAM cell with the additional resistors in accordance with one embodiment of the present invention. The inverter includes a PMOSFET 202 and a NMOSFET 204, with commonly connected gates and a high resistance extension 206 thereof. The two gates are connected by a metal silicided surface 208 of a gate poly 210. The silicide shorts the oppositely doped sections of the gate poly 210 and insures low resistance through both sections. The unsilicided high resistance extension 206 of the gate poly 210 is placed above a shallow trench isolation (STI) 212 and has resistance controlled only by its doping. The resistance is therefore high. This high resistance provides the high-value resistor constructed between the metal silicided surface 208 of the gate poly 210 and the node of the opposite inverter.

FIG. 2B illustrates a circuit diagram 214 equivalent to the device in FIG. 2A in accordance with one embodiment of the present invention. A capacitor 216 has a capacitance value of that of the PMOSFET 202, while a capacitor 218 has a capacitance value of that of the NMOSFET 204. A resistor 220, in series with the capacitances, has the value of the resistance of the unsilicided extension of the gate poly, which is a high-value resistance.

Figure 2C:
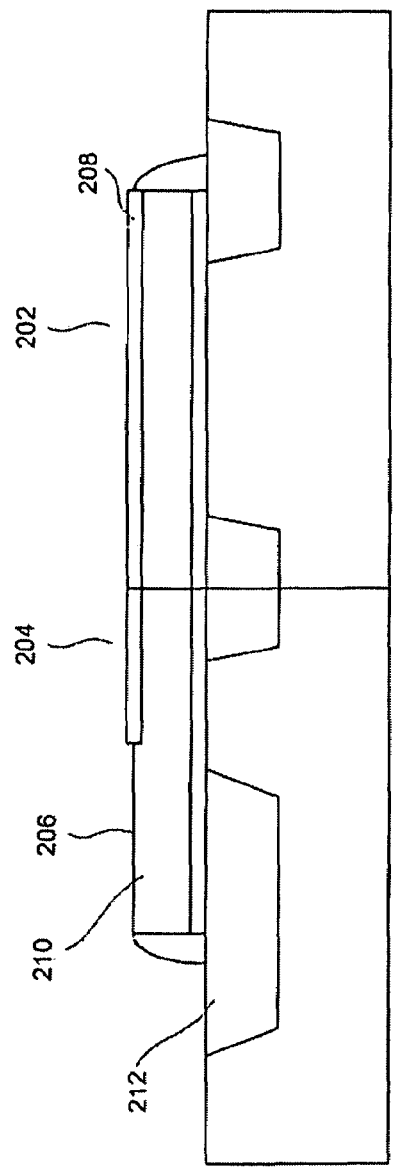
FIG. 2C illustrates a cross section of the inverters of the SRAM cell with the additional resistors in accordance with one embodiment of the present invention.

FIG. 2C presents a cross section 222 illustrating the option of placing the unsilicided high-value resistance section on the NMOSFET 204 end of the gate poly 210. It is a mirror image of what is depicted in FIG. 2B. The cross section 222 includes the PMOSFET 202 and the NMOSFET 204 of one inverter, with commonly connected gates and the high resistance extension 206 of the gates. The two gates are connected by the metal silicided surface 208 of the gate poly 210. The silicide shorts the oppositely doped sections of the gate poly 210 and insures low resistance through both sections. The unsilicided high resistance extension 206 of the gate poly 210 is placed above the STI 212 and has resistance controlled only by its doping. This high resistance provides the high-value resistor constructed between the low resistance metal silicided surface 208 of the gate poly 210 and the node of the opposite inverter.

FIG. 3A presents a cross section 300 of the structure as illustrated in FIG. 2A with a first metal layer or metal-1 pad 302 connected to the unsilicided high resistance extension 206 of the gate poly 210, on the PMOSFET 202 end, via 304 (which is also filled with metal-1) through an interlevel dielectric (not shown).

Similarly, FIG. 3B illustrates a cross section 306 of the structure as illustrated in FIG. 2B with a metal-1 pad 308 connected to the unsilicided high resistance extension 206 of the gate poly 212, on the NMOSFET 204 end, via 310 (which is also filled with metal-1) through the interlevel dielectric (not shown).

Figure 4:
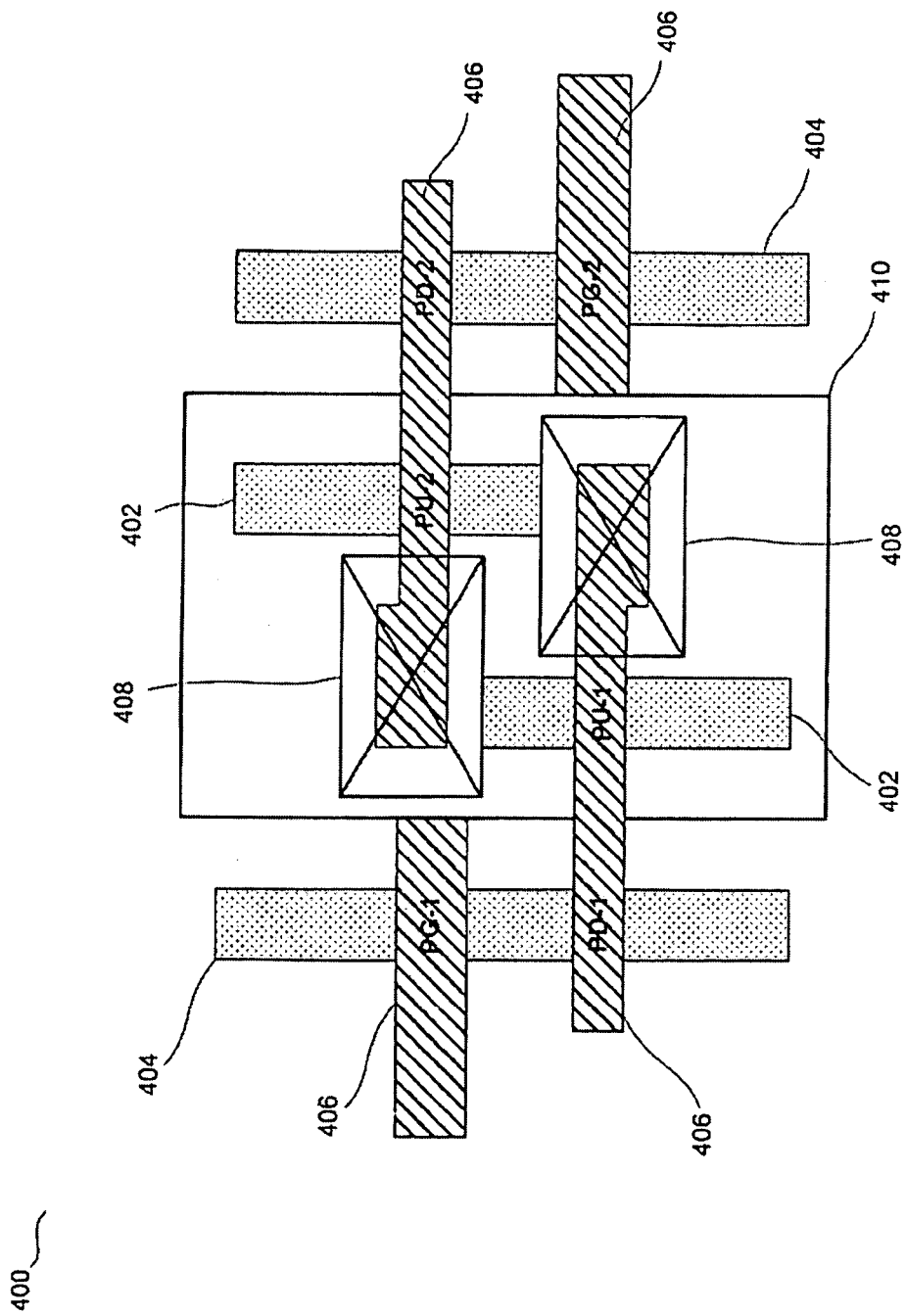
FIG. 4 illustrates an SRAM chip layout up to silicide block in accordance with one embodiment of the present invention.

FIG. 4 illustrates an SRAM chip layout 400 which includes P-active regions 402, N-active regions 404, gate poly structures 406, and silicide block patterns 408. The silicide block patterns 408, which may be an oxide, prevent metal silicide from lowering the resistance of the gate poly structures 406 in an area designed to produce a resistor. It is understood that the P-active 402 regions lie in an N-well 410.

Figure 5:
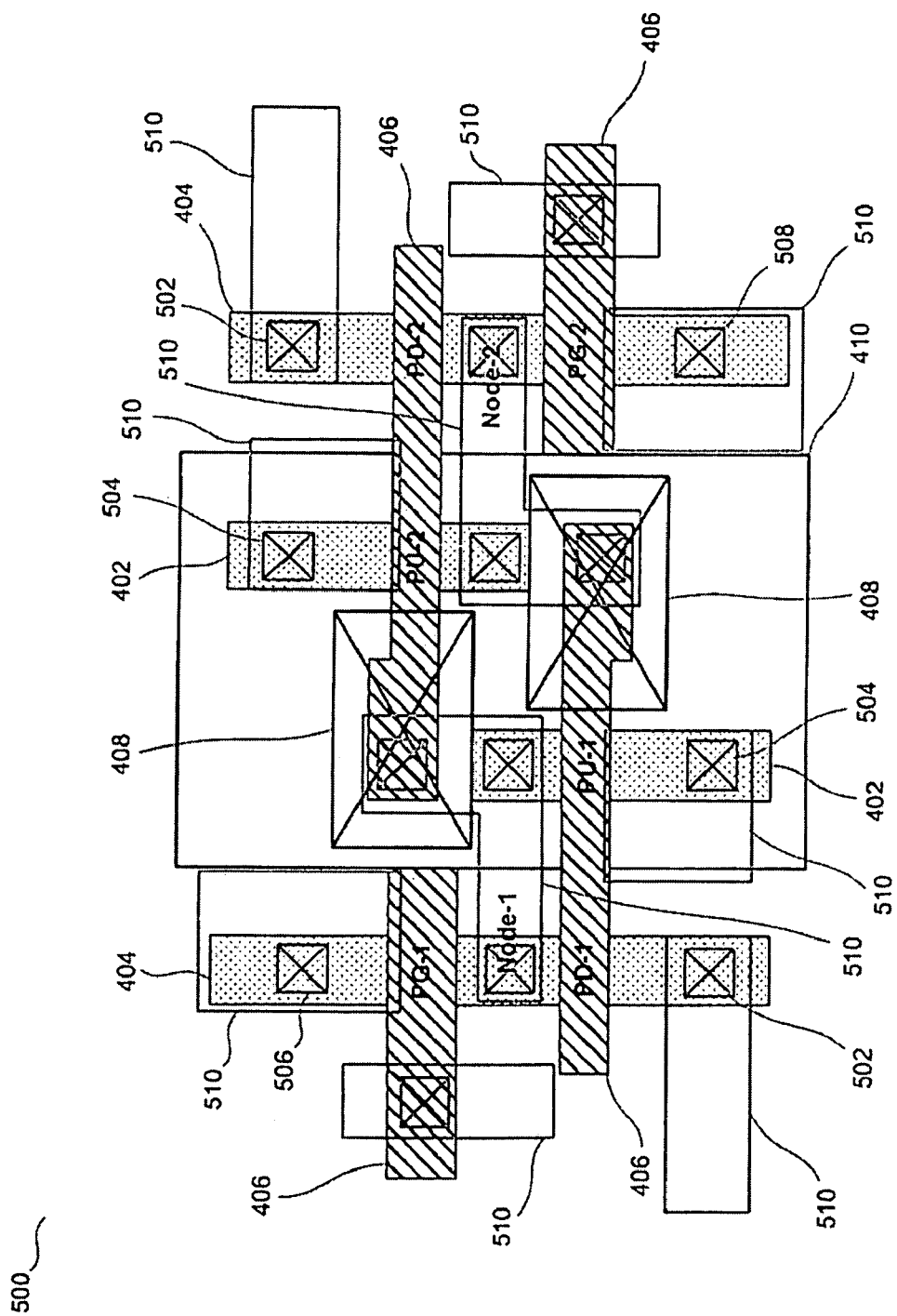
FIG. 5 illustrates an SRAM chip layout up to metal-1 layer in accordance with one embodiment of the present invention.

FIG. 5 illustrates an SRAM chip layout 500 up through P-active regions 402, which lie in the N-well 410, N-active regions 404, gate poly structures 406, the silicide block patterns 408, VSS contacts 502, VCC contacts 504, a bit line BL contact 506, a bit line bar BLB contact 508, and metal-1 patterns 510.

Figure 6:
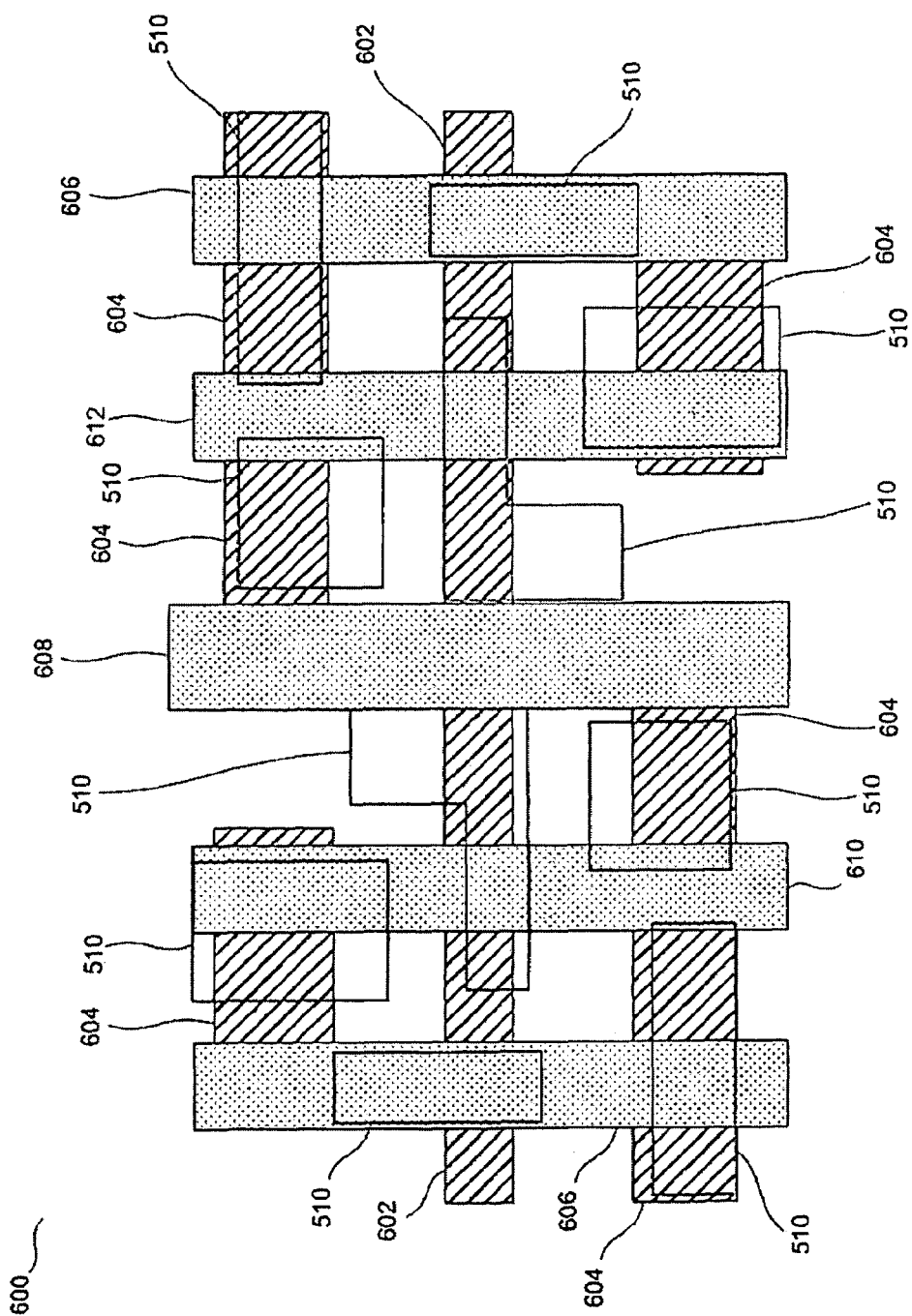
FIG. 6 illustrates an SRAM chip layout for metal-1, metal-2 and metal-3 layers in accordance with one embodiment of the present invention.

FIG. 6 illustrates an SRAM chip layout 600 with metal-1 patterns 510, a second metal layer or metal-2 word line pattern 602, metal-2 landing pad patterns 604, metal-3 VSS lines 606, a third metal layer or metal-3 VCC line 608, a metal-3 bit line 610, and a metal-3 bit line bar 612.

The concern for data integrity may be addressed by slowing down the response of the memory cell to a change in the charge that is stored on only one of the two storage nodes. If the charge that is stored on both storage nodes changes, the change has most likely been caused by data writing from the bit lines. This is because the bit line pairs that write to the two nodes are always oppositely biased. Therefore, a change in only one of the two nodes is most likely not appropriate data and should be avoided. The introduction of resistors between a given storage node of an inverter and the two gates of the opposite inverter introduces a resistor/capacitor (RC) delay time in the change of stored data. Since the two inverters are cross-coupled, the return influence is also delayed. The delay time allows the affected inverter to heal itself and retain its original data.

Now referring to FIG. 1, since bit line BL and bit line bar BLB are always oppositely biased, Node-1 and Node-2 are always oppositely biased. Therefore, the node of an inverter is always oppositely biased from its gates. This is consistent with the fact that the node of an inverter is connected to the opposite of bit line BL or bit line bar BLB from the gates. A high signal on bit line BL, when connected to Node-1 and the gates of the inverter INV-2, by the pass-gate PG-1, drives inverter INV-2 to connect Node-2 to VSS. This is consistent with the opposite bias, a low signal, on bit line bar BLB, which is simultaneously connected to Node 2 and the gates of inverter INV-1 by the pass-gate PG-2, driving inverter INV-1 to connect Node-1 to VCC. A low signal on bit line BL has opposite effects that are similarly traced through the SRAM. Therefore, an SRAM cell is self-stabilized when the pass-gates are switched on by the word line. When the pass-gates are switched off by the word line, an SRAM cell is still self-stabilized because VSS and VCC are connected to opposite nodes, delivering the same influences just previously delivered by bit line BL and bit line bar BLB. To reverse the written data requires that BL and BLB are reversed and that the pass-gates are switched on by the word line. If a spurious signal, such as an alpha particle or electrical noise, arrives in one inverter, then the stable balance may be upset. Even though the disturbed node is connected to either VSS or VCC, the charge stored on the node of a small geometry device is small enough to be disturbed before a power supply can reestablish the data. However, the resistors added here slow down the disturbing influence. There is now a resistor/capacitor R/C series circuit to the node of the opposite inverter. This circuit has an R/C time constant τ, where:

$$\tau = R * C.$$

C is constant and is determined by the gate oxide thickness and gate structure. The discharge time changes with a change in the value of the gate resistance. In an embodiment, the sheet resistance of P+ poly with silicide is 3 to 50 ohm/sq, P+ poly without silicide is 100 to 2,000 ohm/sq, and P-type LDD without silicide is 5,000 to 100,000 ohm/sq. In one embodiment, in a time period equivalent to five times the time constant, the signal delivered in response to a step function may exceed 99% of the amplitude of the step function. The voltage follows the curve:

$$V = V_{step} \exp(-t/\tau)$$

$V_{step}$ is the step-wise change in voltage. In other words, $$-\tau * \log(V/V_{step}) = t.$$

If the charge stored in the capacitance of the gates of one inverter is suddenly changed, it then takes time to deliver that influence to the node of the opposite inverter through the delay of the RC circuit. That delay allows time for the SRAM to re-stabilize itself from the previous set of voltages.

Figure 7:
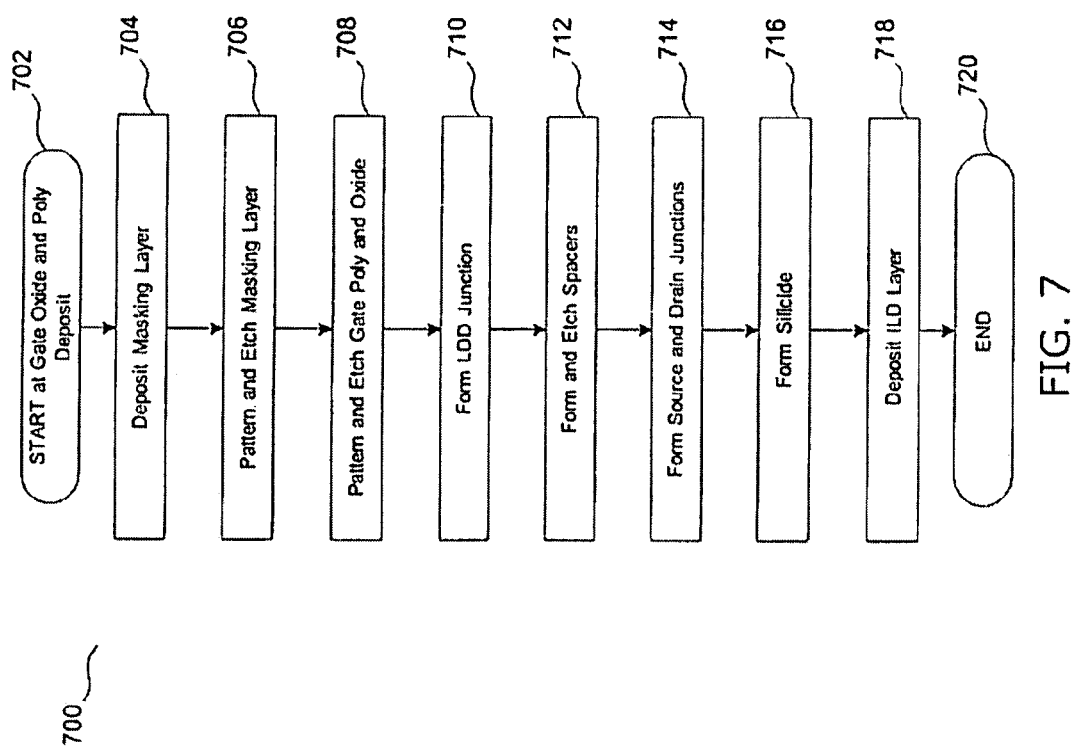
FIGS. 7 to 9 illustrate three resistor-forming process variations in accordance with three embodiments of the present invention.

FIG. 7 illustrates a flow chart 700 for a first resistor-forming process according to one embodiment of the present invention. The relevant processing begins in step 702 with the deposition of gate oxide and gate poly. In step 704, a hard masking layer is deposited, which may be $Si_3N_4$, SiON, oxide, or a combination thereof. In step 706, photoresist is patterned and the masking layer is etched, thereby leaving a specific pattern for silicide-block. In step 708, photoresist is patterned and the gate poly and oxide are etched. In step 710, the LDD junctions are formed. In step 712, oxide, $Si_3N_4$, or a combination thereof is deposited and then etched to form the sidewall spacers through a process such as a dry etch. The mask pattern remains as the silicide-block pattern. In step 714, the source and drain junctions are formed. In step 716, metal is deposited and alloyed to form the silicide layer, except where blocked. In step 718, an interlevel dielectric layer is deposited. This layer may be $Si_3N_4$, SiON, TEOS, PSG, BPSG, or a combination thereof. In step 720, the process ends after the high-value resistor is formed under the silicide-block layer.

Figure 8:
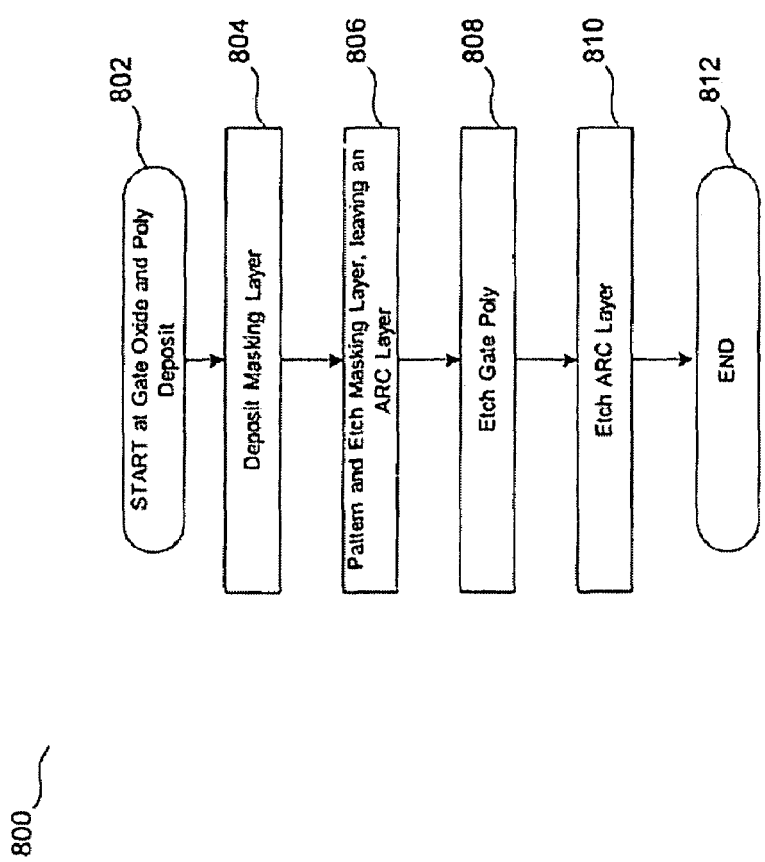

FIG. 8 illustrates a flow chart 800 for a second resistor-forming process according to another embodiment of the present invention. The relevant processing begins in step 802 with the deposition of gate oxide and gate poly. In step 804, a hard mask layer is deposited. In step 806, photoresist is patterned and the masking layer is etched to a limited thickness. The unetched, thick layer pattern is the silicide-block pattern. The remaining thin layer functions as an antireflective (ARC) layer. In step 808, the gate poly is pattern etched to define the transistors. The ARC layer aids in quality pattern definition in the photoresist. In step 810, the thin ARC layer is removed by a wet dip etch. In step 812, the process ends after the high-value resistor is formed under the silicide-block layer.

Figure 9:
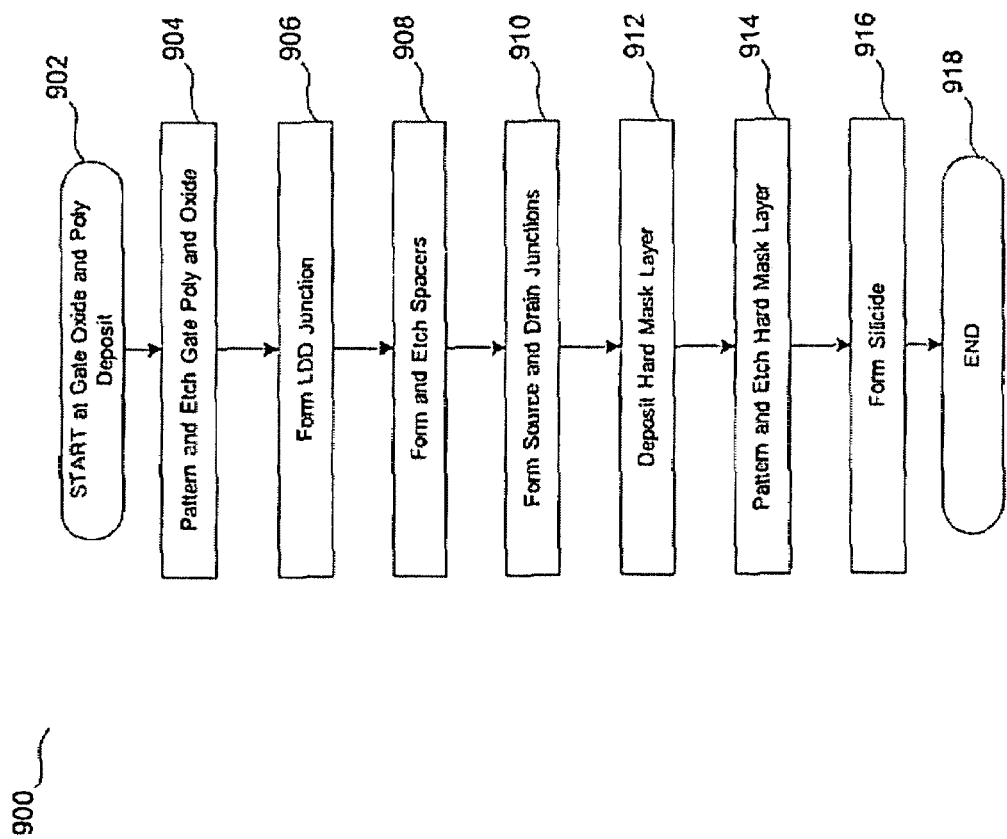

FIG. 9 illustrates a flow chart 900 for a third resistor-forming process in accordance with another embodiment of the present invention. The relevant processing begins in step 902 with the deposition of gate oxide and gate poly. In step 904, photoresist is patterned and the gate poly and oxide are pattern etched. In step 906, the LDD junctions are formed. In step 908, the sidewall spacers are formed and etched. In step 910, the source and drain junctions are formed. In step 912, a hard mask layer is deposited. In step 914, photoresist is patterned and the hard mask layer is etched to leave the silicide-block pattern. The photoresist is also removed. In step 916, metal is deposited and silicide is formed except under the silicide-block pattern. In step 918, the process ends after the high-value resistor is formed under the silicide-block layer.

The above invention describes many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in a design and method for reducing soft error rate of memory cells, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A memory cell for reducing soft error rate comprising:
a first bit line signal (BL);
a second bit line signal complementary to the first bit line signal (BLB);
a first pass gate coupled to the BL;
a second pass gate coupled to the BLB;
a first inverter whose output node receives the BL through the first pass gate;
a second inverter whose output node receives the BLB through the second pass gate;
a first instrument coupled between the output node of the first inverter and an input node of the second inverter; and
a second instrument coupled between the output node of the second inverter and an input node of the first inverter;
wherein the first and second instruments increase voltage discharge time of the memory cell when voltages at the output nodes of the inverters accidentally discharge; and
wherein the first and second instruments are located adjacent to respective PMOS portions of said first and second inverters, said PMOS portion of said first inverter being located between the first instrument and an NMOS portion of said first inverter, said PMOS portion of said second inverter being located between the second instrument and an NMOS portion of said second inverter, said first and second instruments operable for providing a resistor capacitor delay time for reducing soft error rate.

2. The cell of claim 1, wherein each of the first and second instruments includes one or more high resistance instruments.

3. The cell of claim 2, wherein the first instrument is formed by a portion of the gate region of the second inverter that is not metalized and the second instrument is formed by a portion of a gate region of the first inverter that is not metalized.

4. The cell of claim 3, wherein a resistance of the first or second instrument is determined by an impurity concentration in the portion of the gate region that is not metalized.

5. The cell of claim 3, wherein the first or second instrument further includes lightly doped drain (LDD) implant materials.

6. The cell of claim 5, wherein the first or second instrument further includes source/drain implant materials.

7. The cell of claim 1, wherein the gates of each inverter are connected by a metalized portion of a shared gate material thereof.

8. The cell of claim 1, wherein the first and second instruments are formed over an isolation region of the corresponding inverter whose gates are coupled thereto.

9. A pair of CMOS inverters for a split word line static random access memory cell for reducing soft error rate comprising:
   a substrate layer;
   source and drain regions formed in the substrate layer for a first PMOS transistor;
   source and drain regions formed in the substrate layer for a first NMOS transistor;
   source and drain regions formed in the substrate layer for a second PMOS transistor;
   source and drain regions formed in the substrate layer for a second NMOS transistor;
   a first gate dielectric layer shared by the first PMOS and NMOS transistors;
   a second gate dielectric layer shared by the second PMOS and NMOS transistors;
   a first gate shared by the first PMOS and NMOS transistors, and
   a second gate shared by the second PMOS and NMOS transistors;
   wherein a portion of the first gate is metalized to connect gates of the first PMOS and NMOS transistors and is coupled to a first data storage node of the memory cell though a first resistance instrument;
   wherein a portion of the second gate is metalized to connect gates of the second PMOS and NMOS transistors and is coupled to a second data storage node of the memory_cell though a second resistance instrument;
   wherein the first and second resistance instruments function to increase a voltage discharge time when a voltage at the associated data storage node accidentally discharges through the associated inverter; and
   wherein the first and second resistance instruments are located adjacent to the first and second PMOS transistors, respectively, the first PMOS transistor being located between the first resistive instrument and the first NMOS transistor, and the second PMOS transistor being located between the second resistive instrument and the second NMOS transistor, the first and second resistance instruments operable to provide a resistor capacitor delay time for reducing soft error rate.

10. The pair of CMOS inverters of claim 9, wherein the first or second resistance instrument is formed by a remaining portion of the gate that is not metalized.

11. The pair of CMOS inverters of claim 10, wherein a resistance of the first or second resistance instrument is determined by an impurity concentration contained therein.

12. The pair of CMOS inverters of claim 10, wherein the first or second resistance instrument further includes lightly doped drain (LDD) implant material.

13. The pair of CMOS inverters of claim 10, wherein the first or second resistance instrument further includes source/drain implant materials.

14. The pair of CMOS inverters of claim 10, wherein the first or second resistance instrument is formed over an isolation region of the associated inverter.

15. A memory cell for reducing soft error rate comprising:
   a first bit line (BL) coupled to a first pass gate;
   a second bit line complementary to the first bit line (BLB) and coupled to a second pass gate;
   first and second inverters, the first inverter having an output node for connecting to the BL through the first pass gate and the second inverter having an output node for connecting to the BLB through the second pass gate;
   first and second resistive elements, the first resistive element coupled between the output node of the first inverter and an input node of the second inverter, and the second resistive element coupled between the output node of the second inverter and an input node of the first inverter;
   wherein the first and second resistive elements increase a voltage discharge time of the memory cell when voltages at the output nodes of the first and second inverters accidentally discharge; and
   wherein the first and second resistive elements are located adjacent to respective PMOS portions of the first and second inverters, the PMOS portion of the first inverter being located between the first resistive element and an NMOS portion of said first inverter, said PMOS portion of said second inverter being located between the second resistive element and an NMOS portion of the second inverter, the first and second instruments operable for providing a resistor capacitor delay time for reducing a soft error rate.

16. The memory cell of claim 15, wherein the first resistive element is formed by a portion of the gate region of the second inverter that is not metalized and the second resistive element is formed by a portion of a gate region of the first inverter that is not metalized.

17. The memory cell of claim 16, wherein a resistance of the first or second resistive element is determined by an impurity concentration in the portion of the gate region that is not metalized.

18. The memory cell of claim 16, wherein the first or second resistive element further includes lightly doped drain (LDD) implant materials.

19. The memory cell of claim 15, wherein the gates of each inverter are connected by a metalized portion of a shared gate material thereof.

20. The memory cell of claim 15, wherein the first and second resistive elements are formed over an isolation region of the corresponding inverter whose gates are coupled thereto.

* * * * *